United States Patent
Hyot et al.

(10) Patent No.: US 9,991,342 B2
(45) Date of Patent: Jun. 5, 2018

(54) ELECTRONIC DEVICE CONTAINING NANOWIRE(S), EQUIPPED WITH A TRANSITION METAL BUFFER LAYER, PROCESS FOR GROWING AT LEAST ONE NANOWIRE, AND PROCESS FOR MANUFACTURING A DEVICE

(71) Applicants: COMMISSARIAT A L'ENERGIE ATOMIQUE ET AUX ENERGIES ALTERNATIVES, Paris (FR); ALEDIA, Grenoble (FR)

(72) Inventors: Bérangère Hyot, Eybens (FR); Benoit Amstatt, Grenoble (FR); Marie-Françoise Armand, Vaulnaveys-le-Haut (FR); Florian Dupont, Grenoble (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 0 days. days.

(21) Appl. No.: 14/438,497

(22) PCT Filed: Oct. 25, 2013

(86) PCT No.: PCT/EP2013/072426
§ 371 (c)(1),
(2) Date: Apr. 24, 2015

(87) PCT Pub. No.: WO2014/064264
PCT Pub. Date: May 1, 2014

(65) Prior Publication Data
US 2015/0295041 A1     Oct. 15, 2015

(30) Foreign Application Priority Data
Oct. 26, 2012 (FR) .................... 12 60209

(51) Int. Cl.
*H01L 29/06* (2006.01)
*H01L 21/02* (2006.01)
(Continued)

(52) U.S. Cl.
CPC .......... *H01L 29/0676* (2013.01); *B82Y 10/00* (2013.01); *B82Y 40/00* (2013.01);
(Continued)

(58) Field of Classification Search
CPC ................................................. H01L 29/0676
(Continued)

(56) References Cited

U.S. PATENT DOCUMENTS 5,254,499 A    10/1993  Sandhu et al.
5,580,823 A    12/1996  Hegde et al.
(Continued)

FOREIGN PATENT DOCUMENTS

CN    101330099 A    12/2008
CN    102255018 A    11/2011
(Continued)

OTHER PUBLICATIONS

International Search Report dated Jun. 2, 2014, issued in corresponding application No. PCT/EP2013/072426.
(Continued)

*Primary Examiner* — Errol Fernandes
(74) *Attorney, Agent, or Firm* — Westerman, Hattori, Daniels & Adrian, LLP

(57) ABSTRACT

The electronic device comprises a substrate (1), at least one semiconductor nanowire (2) and a buffer layer (3) interposed between the substrate (1) and said nanowire (2). The buffer layer (3) is at least partly formed by a transition metal nitride layer (9) from which extends the nanowire (2), said transition metal nitride being chosen from: vanadium nitride,
(Continued)

Figure 1:
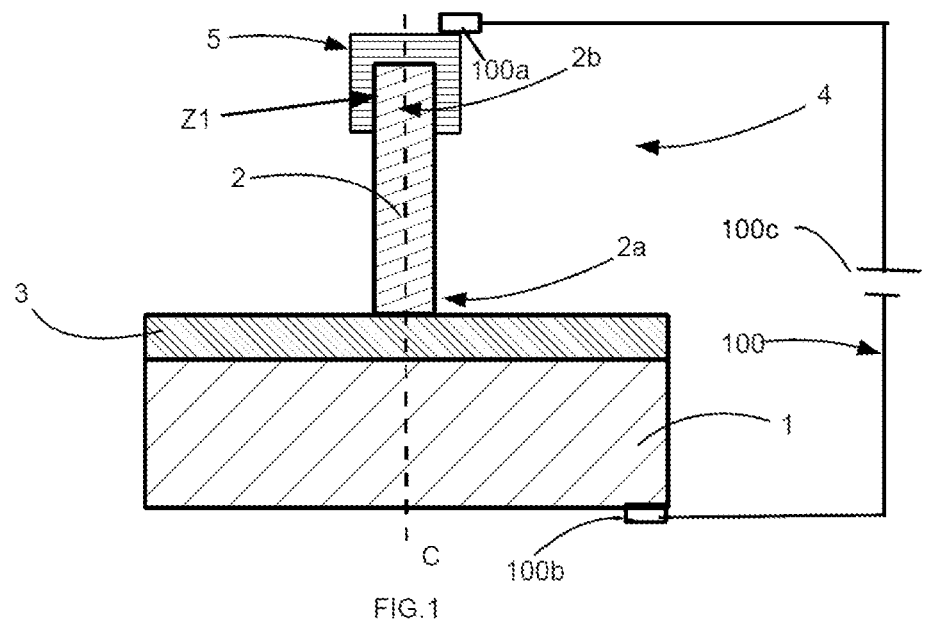

chromium nitride, zirconium nitride, niobium nitride, molybdenum nitride, hafnium nitride or tantalum nitride.

27 Claims, 4 Drawing Sheets

(51) Int. Cl.
| | |
|---|---|
| H01L 33/04 | (2010.01) |
| B82Y 10/00 | (2011.01) |
| B82Y 40/00 | (2011.01) |
| C30B 25/00 | (2006.01) |
| C30B 25/18 | (2006.01) |
| C30B 29/16 | (2006.01) |
| C30B 29/36 | (2006.01) |
| C30B 29/40 | (2006.01) |
| C30B 29/60 | (2006.01) |
| H01L 29/40 | (2006.01) |
| H01L 29/66 | (2006.01) |
| H01L 29/41 | (2006.01) |
| H01L 33/16 | (2010.01) |
| H01L 33/12 | (2010.01) |
| B82Y 99/00 | (2011.01) |
| H01L 33/24 | (2010.01) |

(52) U.S. Cl.
CPC .......... *C30B 25/005* (2013.01); *C30B 25/183* (2013.01); *C30B 29/16* (2013.01); *C30B 29/36* (2013.01); *C30B 29/40* (2013.01); *C30B 29/406* (2013.01); *C30B 29/605* (2013.01); *H01L 21/0254* (2013.01); *H01L 21/0262* (2013.01); *H01L 21/02104* (2013.01); *H01L 21/02381* (2013.01); *H01L 21/02389* (2013.01); *H01L 21/02439* (2013.01); *H01L 21/02458* (2013.01); *H01L 21/02603* (2013.01); *H01L 29/401* (2013.01); *H01L 29/413* (2013.01); *H01L 29/6609* (2013.01); *H01L 33/04* (2013.01); *H01L 33/12* (2013.01); *H01L 33/16* (2013.01); *B82Y 99/00* (2013.01); *H01L 33/24* (2013.01); *Y10S 977/762* (2013.01); *Y10S 977/84* (2013.01); *Y10S 977/932* (2013.01)

(58) Field of Classification Search
USPC .................. 257/98, 774; 438/2, 287, 785
See application file for complete search history.

(56) References Cited

U.S. PATENT DOCUMENTS

| | | | |
|---|---|---|---|
| 5,593,511 A | 1/1997 | Foster et al. | |
| 5,628,829 A | 5/1997 | Foster et al. | |
| 6,093,645 A | 7/2000 | Ameen et al. | |
| 6,297,063 B1 * | 10/2001 | Brown | H01L 23/49877 |
| | | | 257/E21.705 |
| 6,447,838 B1 | 9/2002 | Azuma et al. | |
| 6,617,060 B2 | 9/2003 | Weeks, Jr. et al. | |
| 6,818,061 B2 | 11/2004 | Peczalski et al. | |
| 7,335,908 B2 | 2/2008 | Samuelson et al. | |
| 7,354,850 B2 | 4/2008 | Seifert et al. | |
| 7,365,374 B2 | 4/2008 | Piner et al. | |
| 7,682,943 B2 | 3/2010 | Samuelson et al. | |
| 7,745,813 B2 | 6/2010 | Samuelson et al. | |
| 7,791,106 B2 | 9/2010 | Piner et al. | |
| 7,829,443 B2 | 11/2010 | Seifert et al. | |
| 7,911,035 B2 | 3/2011 | Seifert et al. | |
| 8,049,203 B2 | 11/2011 | Samuelson et al. | |
| 8,105,921 B2 | 1/2012 | Weeks, Jr. et al. | |
| 8,450,717 B1 | 5/2013 | Samuelson et al. | |
| 8,772,626 B2 | 7/2014 | Samuelson et al. | |
| 8,928,034 B2 | 1/2015 | Weeks, Jr. et al. | |
| 8,928,035 B2 | 1/2015 | Weeks, Jr. et al. | |
| 8,937,335 B2 | 1/2015 | Weeks, Jr. et al. | |
| 8,986,835 B2 | 3/2015 | Wildeson et al. | |
| 9,679,966 B2 | 6/2017 | Hyot et al. | |
| 9,698,011 B2 | 7/2017 | Hyot et al. | |
| 2001/0001954 A1 | 5/2001 | Urabe | |
| 2002/0007881 A1 | 2/2002 | Daaland et al. | |
| 2002/0086534 A1 | 7/2002 | Cuomo et al. | |
| 2002/0117677 A1 | 8/2002 | Okuyama et al. | |
| 2002/0197825 A1 | 12/2002 | Usui et al. | |
| 2003/0102444 A1 | 6/2003 | Deppert et al. | |
| 2004/0004242 A1 | 1/2004 | Yamamoto | |
| 2004/0074364 A1 | 4/2004 | Prudhomme | |
| 2004/0132315 A1 | 7/2004 | Chambers et al. | |
| 2005/0006673 A1 | 1/2005 | Samuelson et al. | |
| 2005/0233093 A1 | 10/2005 | Tada et al. | |
| 2006/0019470 A1 | 1/2006 | Seifert et al. | |
| 2006/0048866 A1 | 3/2006 | Takada et al. | |
| 2006/0270200 A1 | 11/2006 | Shibata | |
| 2007/0248132 A1 | 10/2007 | Kikuchi et al. | |
| 2008/0017278 A1 | 1/2008 | Nagae et al. | |
| 2008/0036038 A1 | 2/2008 | Hersee et al. | |
| 2008/0057344 A1 | 3/2008 | Murakami et al. | |
| 2008/0105296 A1 | 5/2008 | Samuelson et al. | |
| 2008/0142784 A1 | 6/2008 | Samuelson et al. | |
| 2008/0142926 A1 | 6/2008 | Seifert et al. | |
| 2008/0149914 A1 | 6/2008 | Samuelson et al. | |
| 2008/0149944 A1 | 6/2008 | Samuelson et al. | |
| 2008/0188064 A1 | 8/2008 | Samuelson et al. | |
| 2008/0224115 A1 | 9/2008 | Bakkers et al. | |
| 2008/0233692 A1 | 9/2008 | Yu et al. | |
| 2008/0261378 A1 | 10/2008 | Yao et al. | |
| 2009/0098343 A1 | 4/2009 | Arena et al. | |
| 2009/0321738 A1 | 12/2009 | Kim et al. | |
| 2010/0096614 A1 | 4/2010 | Kim et al. | |
| 2010/0124025 A1 | 5/2010 | Yamaguchi et al. | |
| 2010/0133509 A1 | 6/2010 | Kawashima et al. | |
| 2010/0163840 A1 | 7/2010 | Seifert et al. | |
| 2010/0276664 A1 | 11/2010 | Hersee | |
| 2010/0283064 A1 | 11/2010 | Samuelson et al. | |
| 2011/0062453 A1 | 3/2011 | Armitage | |
| 2011/0079766 A1 | 4/2011 | Wildeson et al. | |
| 2011/0127490 A1 | 6/2011 | Mi | |
| 2011/0133160 A1 | 6/2011 | Yu et al. | |
| 2011/0140072 A1 | 6/2011 | Varangis et al. | |
| 2012/0001303 A1 | 1/2012 | Huang et al. | |
| 2012/0045903 A1 * | 2/2012 | Harada | C23C 16/34 |
| | | | 438/785 |
| 2012/0061646 A1 | 3/2012 | Yi et al. | |
| 2012/0068153 A1 | 3/2012 | Seong et al. | |
| 2012/0187376 A1 | 7/2012 | Tomioka et al. | |
| 2012/0205613 A1 | 8/2012 | Mi et al. | |
| 2012/0313078 A1 | 12/2012 | Fukui et al. | |
| 2013/0127099 A1 | 5/2013 | Mimura et al. | |
| 2013/0146835 A1 | 6/2013 | Samuelson et al. | |
| 2013/0207075 A1 | 8/2013 | Myers et al. | |
| 2013/0221322 A1 | 8/2013 | Ohlsson | |
| 2014/0061832 A1 | 3/2014 | Emboras et al. | |
| 2014/0080290 A1 | 3/2014 | Eymery et al. | |
| 2014/0097401 A1 | 4/2014 | Robin | |
| 2014/0117308 A1 | 5/2014 | Hyot et al. | |
| 2014/0120637 A1 | 5/2014 | Hyot et al. | |
| 2015/0027523 A1 | 1/2015 | Samuelson et al. | |
| 2015/0280053 A1 | 10/2015 | Gilet et al. | |
| 2015/0333225 A1 | 11/2015 | Samuelson et al. | |

FOREIGN PATENT DOCUMENTS

| | | |
|---|---|---|
| DE | 10 2010 012711 A1 | 9/2011 |
| EP | 1 246 233 A2 | 10/2002 |
| EP | 1 796 180 A1 | 6/2007 |
| EP | 2284868 A1 | 2/2011 |
| EP | 2290710 A1 | 3/2011 |
| JP | 2000-036466 A | 2/2000 |
| JP | 2003-293070 A | 10/2003 |
| JP | 2006-278368 A | 10/2006 |
| JP | 2008-169060 A | 7/2008 |
| JP | 2009-221083 A | 10/2009 |

(56) References Cited

FOREIGN PATENT DOCUMENTS

| | | |
|---|---|---|
| JP | 2009-542560 A | 12/2009 |
| JP | 2010-062482 A | 3/2010 |
| JP | 2010-515651 A | 5/2010 |
| JP | 2010-534612 A | 11/2010 |
| JP | 2012-77345 A | 4/2012 |
| KR | 20100126103 A | 12/2010 |
| TW | 201020206 A | 6/2010 |
| WO | 02/44444 A1 | 6/2002 |
| WO | 2004004927 A2 | 1/2004 |
| WO | 2006/126330 A1 | 11/2006 |
| WO | 2007102781 A1 | 9/2007 |
| WO | 2008/048704 A2 | 4/2008 |
| WO | 2008085129 A1 | 7/2008 |
| WO | 2008/149548 A1 | 12/2008 |
| WO | 2009072631 A1 | 6/2009 |
| WO | 2010/022064 A1 | 2/2010 |
| WO | 2011/040012 A1 | 4/2011 |
| WO | 2011/162715 A1 | 12/2011 |
| WO | 2011/162715 A9 | 12/2011 |
| WO | 2012/043885 A1 | 4/2012 |
| WO | 2012136665 A1 | 10/2012 |

OTHER PUBLICATIONS

French Search Report dated Jul. 30, 2013, issued in corresponding application No. FR 1260209; w/ English translation.
International Search Report dated Jun. 5, 2014, issued in co-pending application No. PCT/EP2013/072424.
French Search Report dated Jul. 10, 2013, issued in application No. FR 1260208 corresponding to co-pending application No. PCT/EP2013/072426; w/ English partial translation and partial machine translation.
Oliver et al., "Organometallic vapor phase epitaxial growth of GaN on ZrN/AlN/Si substrates", Applied Physics Letters, vol. 93, 023109, 2008, 3 pages (in English); cited in the French Search Report of corresponding FR1260209.
Office Action dated May 18, 2015 issued in co-pending U.S. Appl. No. 14/064,916 (13 pages) (WO2011/162715 cited in the Office Action is not listed in this IDS since it was already listed in a previous IDS).
Sang et al., "Structural and stimulated emission characteristics of diameter-controlled ZnO nanowires using buffer structure", J. Phys. D: Appl. Phys. 42 (2009) 225403 (pp. 1-6). Oct. 29, 2009.
Office Action dated Apr. 8, 2016 issued in co-pending U.S. Appl. No. 14/064,916 (with PTO892, without PTO1449, 11 pages).
International Search Report and Written Opinion dated Jan. 17, 2014 in counterpart PCT Application No. PCT/EP2013/072448 of co-pending U.S. Appl. No. 14/438,188 (in English; ISR cited by Applicants in co-pending U.S. Appl. No. 14/438,188; 17 pages).
International Preliminary Report on Patentability dated Apr. 28, 2015 in counterpart PCT Application No. PCT/EP2013/072448 of co-pending U.S. Appl. No. 14/438,188 (in English; ISR cited by Applicants in co-pending U.S. Appl. No. 14/438,188; 13 pages).
Chen, X. et al., "Homoepitaxial growth of catalyst-free GaN wires on N-polar substrates", Applied Physics Letters, AIP, American Institute of Physics, Melville, NY, US, vol. 97, No. 15, Oct. 13, 2010 (in English; cited by Applicants in co-pending U.S. Appl. No. 14/438,188; 3 pages).
Song, K. et al., "Selective area growth of GaN nanowires using metalorganic chemical vapor deposition on nano-patterened Si (111) formed by the etching of nano-sized Au droplets", Thin Solid Films, 520(1 ), (2011) 126-130 (in English; cited by Applicants in co-pending U.S. Appl. No. 14/438,188).
Noborisaka, J. et al., "Catalyst-free growth of GaAs nanowires by selective-area metalorganic vapor-phase epitaxy", Applied Physics Letters 86.21 (2005): 213102 (in English; cited by Applicants in co-pending US. Appl. No. 14/438,188; 3 pages).

Office Action dated Mar. 30, 2016 issued in co-pending U.S. Appl. No. 14/438,188 (with PTO892, without SB08, 9 pages).
International Written Opinion dated Jun. 5, 2014 issued in application No. PCT/EP2013/072424 corresponding to co-pending U.S. Appl. No. 14/438,480 (with English translation; 31 pages).
International Written Opinion dated Jun. 2, 2014 issued in application No. PCT/EP2013/072426 corresponding to co-pending U.S. Appl. No. 14/438,497 (with English translation; 33 pages).
Office Action dated Apr. 5, 2016 issued in co-pending U.S. Appl. No. 14/438,480 (with PTO892, without PTO1449, 27 pages).
Search Report issued by STIC Database Tracking No. 483674—Re: For Process for Growing at Least One Nanawire Using a Transition Metal Nitride Layer Obtained in two Steps, dated Apr. 27, 2015; in co-pending U.S. Appl. No. 14/064,858 (8 pages).
Kuang-Wei et al.. "InN nanorods prepared with CrN nanoislands by plasma-assisted molecular beam epitaxy", Nanoscale Research Letters, 2011, pp. 1-6; in co-pending U.S. Appl. No. 14/064,858.
Liu et al., "Growth of InN nanorods prepared by plasma-assisted molecular beam epitaxy with varying Cr thicknesses", Journal of Crystal Growth, vol. 347, 2012, pp. 113-118; in co-pending U.S. Appl. No. 14/064,858.
Office Action dated Nov. 30, 2015 issued in co-pending U.S. Appl. No. 14/064,858 (9 pages).
Office Action dated Oct. 6, 2015 issued in co-pending U.S. Appl. No. 14/064,916 (12 pages).
Advisory Action and Interview Summary dated Feb. 11, 2016 issued in co-pending U.S. Appl. No. 14/064,916 (8 pages).
Final Office Action dated Feb. 2, 2017 in co-pending U.S. Appl. No. 14/438,480 (without SB08, 38 pages).
Notice of Allowance dated Aug. 24, 2016 in co-pending U.S. Appl. No. 14/438,188 (7 pages).
Final Office Action dated Nov. 18, 2016 in co-pending U.S. Appl. No. 14/064,916 (without returned SB08, 5 pages).
Office Action dated Jul. 29, 2016 issued in co-pending U.S. Appl. No. 14/064,858 (without SB08, 8 pages) (US20130221322 to Ohlsson and US20100124025 to Yamaguchi et al. cited in the Office Action are not listed in this IDS since each was listed in a previous IDS filed on Apr. 24, 2015 and Feb. 24, 2016, respectively).
Japanese Office Action and search report dated Jul. 4, 2017 in Japanese application No. 2015-538536 corresponding to co-pending U.S. Appl. No. 14/438,188 (now U.S. Pat. No. 9,537,044) (with English machine translation; 58 pages) (D5 WO2012/136665 and D8 US20120068153 cited in the Japanese Office Action are not listed in this IDS since they were already listed in the IDS filed Jun. 6, 2016 and Apr. 24, 2015, respectively).
Office Action dated Jul. 14, 2017 in co-pending U.S. Appl. No. 14/438,480 (without returned SB08, 31 pages).
Chinese Office Action and search report dated Jul. 5, 2017 in Chinese application No. 201380056223.3 corresponding to co-pending U.S. Appl. No. 14/438,188 (now U.S. Pat. No. 9,537,044) (with English machine translation; 15 pages).
Notice of Allowance dated Mar. 10, 2017 in co-pending U.S. Appl. No. 14/064,916 (without returned SB08, 10 pages).
Japanese Office Action and search report dated Aug. 1, 2017 in Japanese application No. 2015-538470 corresponding to co-pending U.S. Appl. No. 14/438,480 (with English machine translation; 28 pages) (D1 Sang et al., J. Phys. D: Appl. Phys. 42 (2009) 225403 (pp. 1-6), D5 US20110127490, and D6 WO2011/162715, are not listed in this IDS since they were already listed in the IDS filed Jul. 22, 2015 and Apr. 24, 2015, respectively).
English translation of Japanese Office Action dated Aug. 1, 2017 in Japanese application No. 2015-538470 corresponding to co-pending U.S. Appl. No. 14/438,480 (3 pages).
Chinese Office Action and search report dated Feb. 24, 2017 in corresponding Chinese application No. 201380063090.2 (with English machine translation; 13 pages).
Final Office Action dated Dec. 28, 2018 co-pending U.S. Appl. No. 14/438,480 (with PTO892; without returned SB08; 36 pages).

\* cited by examiner

ELECTRONIC DEVICE CONTAINING NANOWIRE(S), EQUIPPED WITH A TRANSITION METAL BUFFER LAYER, PROCESS FOR GROWING AT LEAST ONE NANOWIRE, AND PROCESS FOR MANUFACTURING A DEVICE

TECHNICAL FIELD OF THE INVENTION

The invention relates to the field of semiconductor materials and more precisely that of devices containing semiconductor nanowire(s).

The invention relates more particularly to a device comprising a substrate, at least one semiconductor nanowire and a buffer layer interposed between the substrate and said nanowire.

Prior Art

In the field of nanowire growth, it is known practice to use nucleation layers such as AlN (aluminum nitride) or TiN (titanium nitride). These layers may be deposited directly by LPCVD (low-pressure chemical vapor deposition) or by APCVD (atmospheric-pressure chemical vapor deposition) as described in document WO 2011/162715.

This document WO 2011/162715 states that semiconductor nanowires have a growth that may be promoted if the crystallographic orientation of a crystalline substrate enabling the growth is oriented in the direction [111] in a face-centered cubic structure of "NaCl" type, or in the direction [0001] or along the axis "c" in a "hexagonal" structure.

If the substrate is not correctly oriented, it is possible to deposit an AlN or TiN nucleation layer whose crystallographic structure will have a predominance of orientation in the direction [0001] for AlN which has a hexagonal structure and in the direction [111] for TiN which has an fcc structure.

It results from the foregoing that the crystallographic orientation of the growth support for nanowires is important. The predominance in a correct direction of a crystallographic structure should thus be optimized in order to promote the growth of the nanowires from this crystallographic structure.

Moreover, the nucleation layer should not be an obstacle to the polarization of a nanowire-based light-emitting nanodiode, for example performed by injection of electrons by the substrate to the nanowire via the nucleation layer, the nanowire constituting the N part of the PN junction of the nanodiode. A solution must therefore be found whereby this polarization may be optimized while at the same time conserving or providing new advantages during the growth of the nanowires.

Object of the Invention

The aim of the present invention is to propose a device whose nanowire has a good crystallographic orientation and advantageously allows optimized polarization of the nanowire.

Steps toward this aim are taken by an electronic device comprising a substrate, at least one semiconductor nanowire and a buffer layer interposed between the substrate and said nanowire, the buffer layer being formed at least partly by a transition metal nitride layer from which extends the nanowire, said transition metal nitride being chosen from: vanadium nitride, chromium nitride, zirconium nitride, niobium nitride, molybdenum nitride, hafnium nitride or tantalum nitride; in addition the buffer layer is electrically conductive, so as to allow an electrical contact between at least one electrically conductive part of the substrate and the nanowire.

Advantageously, the transition metal nitride layer may be a transition metal-nitrogen stoichiometric compound satisfying the following conditions:
the stoichiometric compound has a proportion of transition metal of between 50% and less than 100%,
the stoichiometric compound has a crystallographic structure favourable to the epitaxy of gallium nitride, especially a face-centred cubic or hexagonal crystallographic structure,
a tolerance $\Delta N$ relative to the nitrogen concentration of less than or equal to 10%.

According to one implementation, the nanowire is made of gallium nitride.

According to one embodiment, the end of the nanowire that is remote from the substrate is electrically doped according to a first type, and the device comprises a doped electrically conducting element of a second type placed at the end of the nanowire that is remote from the substrate so as to form an electrical junction, especially a light-emitting diode junction.

According to a perfection, the device comprises quantum wells placed at the interface between the nanowire and the doped electrically conducting element.

In addition, the device may comprise a nanowire polarization element so as to allow the generation of a light wave at the level of said nanowire.

The invention also relates to a process for growing at least one semiconductor nanowire comprising a step of producing, on a substrate, a buffer layer at least partly formed by a nucleation layer for the growth of the nanowire and a step of growth of the nanowire from the nucleation layer, the nucleation layer being formed by a layer of transition metal nitride chosen from: vanadium nitride, chromium nitride, zirconium nitride, niobium nitride, molybdenum nitride, hafnium nitride or tantalum nitride. Moreover, in addition, the buffer layer may be electrically conductive so as to allow an electrical contact between at least one electrically conductive part of the substrate and the nanowire.

According to a first embodiment, the buffer layer is deposited as a vapor phase from a gas mixture comprising nitrogen and a transition metal chosen from vanadium, chromium, zirconium, niobium, molybdenum, hafnium and tantalum, in particular the buffer layer is deposited at a temperature between room temperature and 400° C.

According to a second embodiment, the buffer layer is produced via the following steps: deposition on the substrate of a layer of a transition metal chosen from vanadium, chromium, zirconium, niobium, molybdenum, hafnium or tantalum; nitridation of at least part of the deposited transition metal layer so as to form the layer of transition metal nitride having a surface intended for the growth of the nanowire, in particular the transition metal layer is deposited at a temperature between room temperature and 400° C.

Advantageously, and in a manner that is applicable to the process in general, the transition metal nitride layer is produced so as to form a transition metal-nitrogen stoichiometric compound satisfying the following conditions:
the stoichiometric compound has a proportion of transition metal of between 50% and less than 100%,
the stoichiometric compound has a crystallographic structure favourable to the epitaxy of GaN, especially a face-centred cubic or hexagonal crystallographic structure, a tolerance ΔN relative to the nitrogen concentration of less than or equal to 10%.

According to an implementation that is applicable to the second embodiment, the nitridation step of said at least part of the transition metal layer is performed so as to at least partly modify the crystallographic structure of the transition metal layer toward a face-centered cubic or hexagonal crystallographic structure, associated with the transition metal nitride layer.

Advantageously, the nitridation step comprises: a first nitridation substep at least partly performed at a first temperature by imposing an injection of a nitridation gas at a first flow rate; a second nitridation substep at least partly performed at a second temperature less than or equal to the first temperature by imposing an injection of the nitridation gas at a second flow rate that may or may not be different from the first flow rate.

According to a particular example, the injected nitridation gas is ammonia, and the first temperature is between 1000° C. and 1050° C., especially equal to 1050° C.; the first flow rate is between 500*V/8 sccm and 2500*V/8 sccm, especially equal to 1600*V/8 sccm; the second temperature is between 950° C. and 1050° C., especially equal to 1000° C.; the second flow rate is between 500*V/8 sccm and 2500*V/8 sccm, especially equal to 500*V/8 sccm; in which V is the total capacity in liters of a corresponding nitridation chamber.

Alternatively, the nitridation step comprises a first nitridation substep at least partly performed at a first temperature by imposing an injection of a nitridation gas at a first flow rate; a second nitridation substep En2 at least partly performed at a second temperature greater than or equal to the first temperature by imposing an injection of the nitridation gas at a second flow rate that may or may not be different from the first flow rate.

In general, it may be considered that the first temperature may be less than or greater than or equal to the second temperature, and preferably less than or greater than the second temperature.

Preferably, the nitridation step is performed in a nitridation chamber placed at a pressure of between 50 mbar and 800 mbar, especially 100 mbar.

For example, the nanowire growth step is performed after the second nitridation substep, or is initiated during the second nitridation substep.

Advantageously, the nanowire growth step comprises a step of injecting Ga so as to form the gallium nitride nanowire, said nanowire extending from a growth surface of the nucleation layer.

According to one implementation, with the substrate being silicon, the step of depositing the transition metal layer is configured such that the interdiffusion of silicon into the deposited transition metal layer is less than 10 nm and/or so as to conserve a non-silicidized slice of the transition metal layer of at least 2 nm.

If the deposited transition metal is chosen from Cr or V, said transition metal is preferentially deposited at a temperature below 100° C.

In the case where the substrate 1 is based on silicon, the step of depositing the transition metal layer 6 preferentially comprises a preliminary step of determining the thickness of the transition metal layer to be deposited, comprising: a step of determining a first diffusion length of the silicon into the transition metal layer during the future deposition of the transition metal layer as a function of the transition metal used and of the deposition temperature; a step of determining a second diffusion length of the silicon into the transition metal layer during the future nitridation step of the transition metal layer; said thickness of the transition metal layer to be deposited being dependent on the desired thickness of the transition metal nitride layer and on a thickness of a silicidized slice of transition metal obtained in the future transition metal layer from the first and second determined diffusion lengths.

According to one implementation, the process may comprise a step in which the substrate is envisioned such that it has a resistivity of between 1 mΩ·cm and 100 mΩ·cm.

Preferably, the process comprises, before deposition of the transition metal layer, a step of deoxidation of a surface of the substrate intended to receive the transition metal layer.

The invention also relates to a process for manufacturing a device as described, comprising a step of performing the growth process as described.

The manufacturing process may advantageously comprise the following steps: the electrical doping of a first type of at least one end of the nanowire which is opposite the substrate; the formation of an electrically doped element of a second type opposite the first type at the end of the nanowire opposite the substrate.

In addition, the manufacturing process may comprise a step of forming quantum wells placed at the interface between the nanowire and the electrically doped element of the second type.

SUMMARY DESCRIPTION OF THE DRAWINGS

Figure 2:
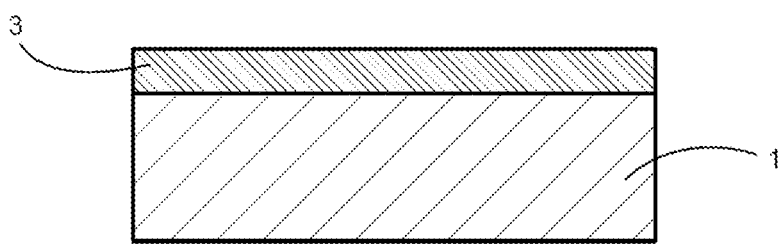
Figure 3:
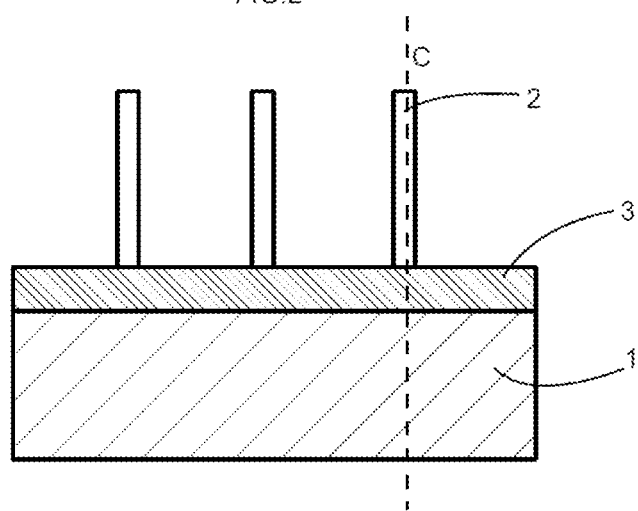
Figure 4:
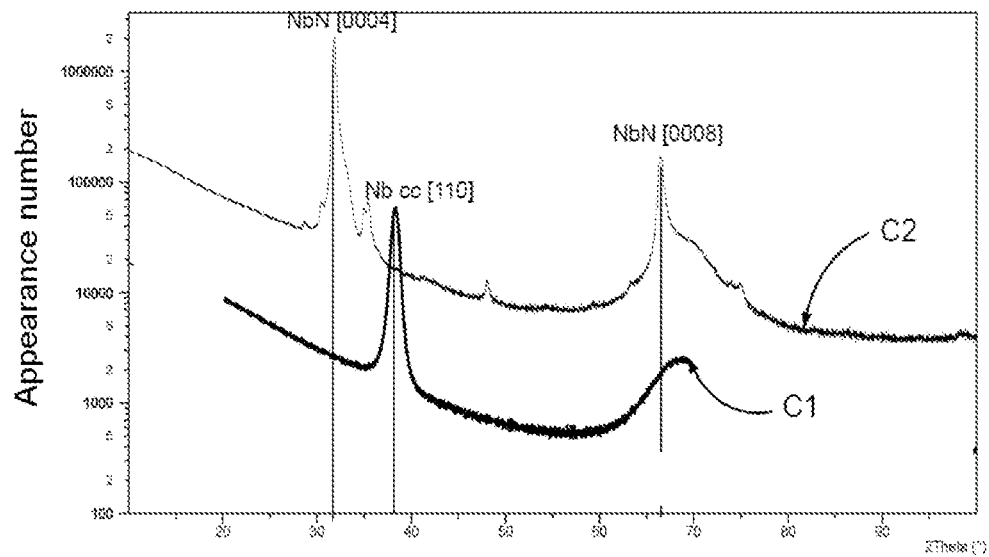
Figure 5:
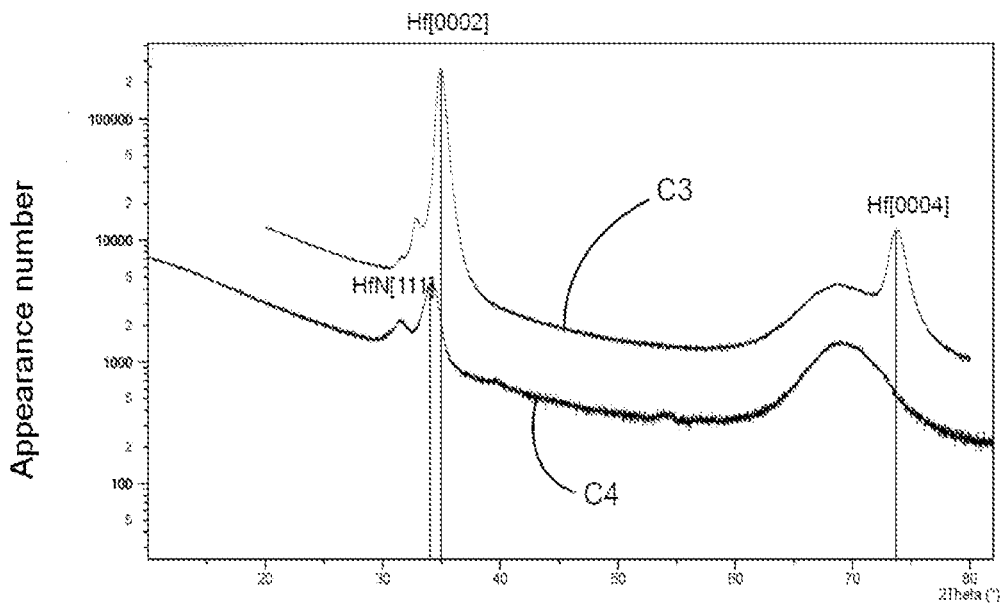
Figure 6:
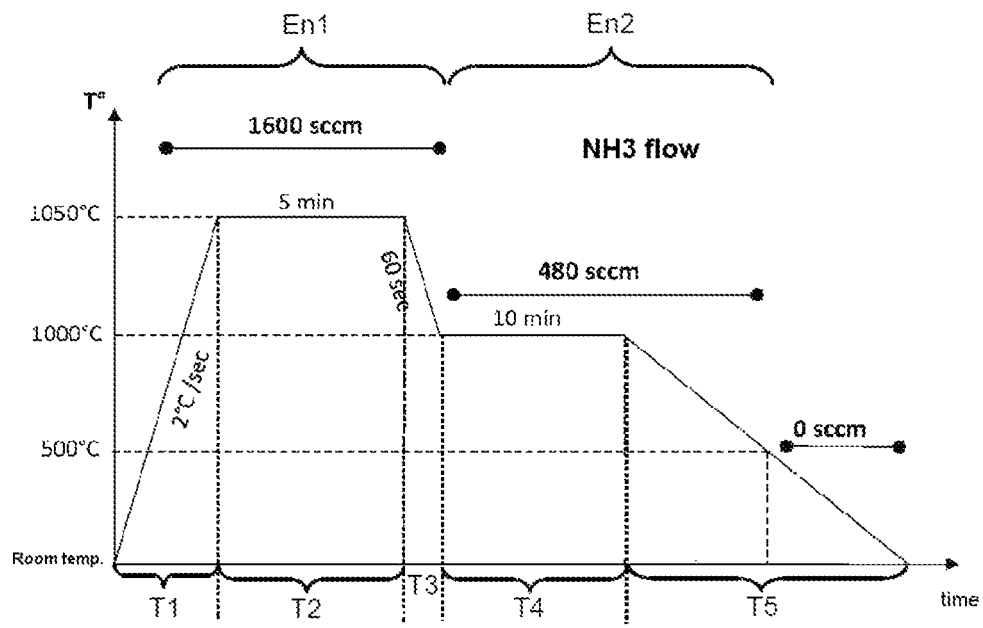
Figure 7:
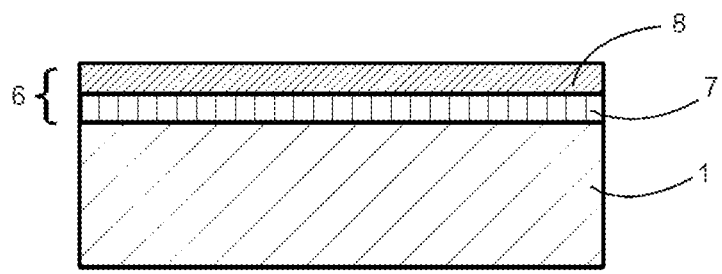
Figure 8:
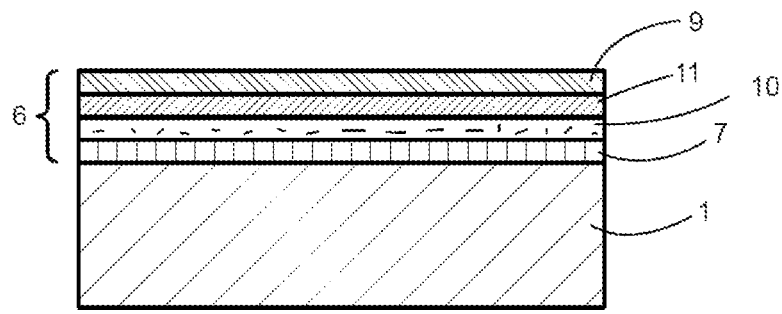
Figure 9:
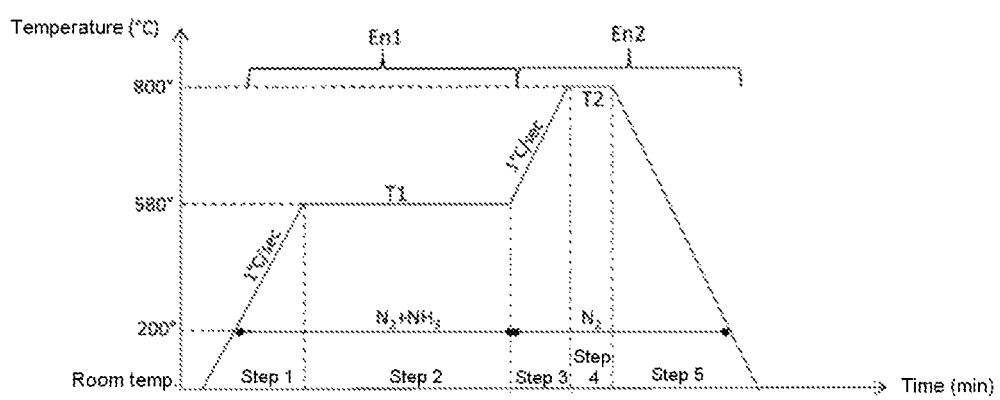

Other advantages and characteristics will emerge more clearly from the description which follows of particular embodiments of the invention, which are given as nonlimiting examples and represented on the attached drawings, in which:

FIG. 1 illustrates a particular embodiment of an electronic device according to the invention, FIG. 2 is a view in cross section of a step of formation of a nucleation layer, FIG. 3 is a view in cross section of a step of nucleation of at least one nanowire from the nucleation layer, FIG. 4 illustrates a representation of the X-ray diffraction spectrum for identifying the types of crystallographic structures present in an Nb-based transition metal layer before nitridation and after nitridation, FIG. 5 illustrates a representation of the X-ray diffraction spectrum for identifying the types of crystallographic structures present in an Hf-based transition metal layer before nitridation and after nitridation, FIG. 6 represents in detail an implementation of a nitridation step according to one embodiment of the invention, FIGS. 7 and 8 illustrate different steps for preparing a nucleation layer, FIG. 9 illustrates in detail another implementation of a nitridation step according to one embodiment of the invention.

DESCRIPTION OF PREFERENTIAL MODES OF THE INVENTION

The device described below differs from the prior art especially in the materials used and intercalated between the nanowire and the substrate.

The term "microwire" or "nanowire" in the rest of the description preferentially means a three-dimensional structure of elongated shape whose longitudinal dimension is at least equal to once the transverse dimension(s), preferably at least five times and even more preferentially at least ten times. The transverse dimension(s) are between 5 nm and 2.5 µm. In certain embodiments, the transverse dimensions may be less than or equal to about 1 µm, preferably between 100 nm and 300 nm. In certain embodiments, the height of each nanowire may be greater than or equal to 500 nm, preferably between 1 µm and 50 µm.

As illustrated in FIG. 1, the electronic device 4 comprises a substrate 1, at least one semiconductor nanowire 2 and a buffer layer 3 interposed between the substrate 1 and said nanowire 2. The buffer layer 3 is formed at least partly by a transition metal nitride layer from which extends the nanowire 2, said transition metal nitride being chosen from: vanadium nitride, chromium nitride, zirconium nitride, niobium nitride, molybdenum nitride, hafnium nitride or tantalum nitride. The term "extends from" means that the nanowire 2 has a defined length between two longitudinal ends 2a, 2b, a first longitudinal end 2a being in contact with the transition metal nitride layer and a second longitudinal end 2b being remote from the transition metal nitride layer. Preferably, the second longitudinal end 2b is the most distant from the transition metal nitride layer.

The choice of this transition metal nitride layer makes it possible to give said transition metal nitride layer electrical conduction nature of metallic type and refractory nature of ceramic type. These properties (metallic/refractory), which are in principle antagonist, may be achieved by the transition metal nitrides mentioned above. In point of fact, the refractory nature may be achieved by a material whose melting point is associated with a temperature above about 1800° C., which is the case for the transition metal nitrides targeted above. In addition, such a transition metal nitride layer was advantageously able to serve as a nucleation layer during growth of the nanowire so as to obtain a nanowire oriented along the axis C substantially perpendicular to the substrate 1. The term "substantially perpendicular to" means exactly perpendicular or perpendicular to more or less 10°. This slight disorientation of more or less 10° nevertheless permits the performance of subsequent technological steps for preparing more complete devices.

Tungsten, although present in the same column of the Periodic Table as chromium and molybdenum, is set aside from the list since it has insufficient stability properties at high temperatures, which does not allow efficient growth of the nanowires. In other words, such a device 4 cannot be obtained, or will be greatly defective, if the transition metal nitride layer is based on tungsten.

Moreover, titanium nitride is also set aside since, during its deposition, it gives rise to defects in the structure of the layer not allowing optimum growth of nanowire(s). Thus, the device 4 would have greater probabilities of being defective.

In particular, the nitride-treated transition metal layer may be a transition metal-nitrogen stoichiometric compound that satisfies the following conditions:
 the stoichiometric compound has a proportion of transition metal of between 50% and less than 100%,
 the stoichiometric compound has a crystallographic structure favourable to the epitaxy of gallium nitride, especially a face-centred cubic or hexagonal crystallographic structure,
 a tolerance ΔN relative to the nitrogen concentration of less than or equal to 10% (i.e. the difference between the minimum nitrogen concentration and the maximum nitrogen concentration of the stoichiometric compound is less than or equal to 10%, this value also being referred to in the art as the stoichiometric difference), this tolerance makes it possible to ensure the chemical and thermal stability of the stoichiometric compound.

For the compounds based on Zr, the envisaged compounds are the mononitride ZrN of cfc structure with an N concentration of between 40% and 50%.

For the compounds based on Hf, the envisaged compounds are $Hf_3N_2$ (nitrogen concentration of 40%) of hexagonal structure and also HfN (with an N concentration of between 42.8% and 52.8%) of fcc structure.

For the compounds based on V, the envisaged compounds are $V_2N$ (nitrogen concentration of between 27% and 32%) of hexagonal structure and also VN (with an N concentration of between 41.9% and 50%) of fcc structure.

For the compounds based on Nb, the envisaged compounds are $Nb_2N$ (nitrogen concentration of between 30% and 34%) of hexagonal structure, $Nb_4N_3$ (with an N concentration of between 42% and 45%) of hexagonal structure, and also NbN (nitrogen concentration of between 48% and 51.4%) of hexagonal or fcc structure.

For the compounds based on Ta, the envisaged compounds are $Ta_2N$ (nitrogen concentration of between 25% and 33%) of hexagonal structure and also TaN (with an N concentration of between 48% and 50%) of hexagonal or fcc structure.

For the compounds based on Cr, the envisaged compounds are $Cr_2N$ of hexagonal structure and also CrN of hexagonal structure.

For the compounds based on Mo, the envisaged compounds are $Mo_2N$ of hexagonal structure and also MoN of hexagonal or fcc structure.

For the mononitrides, in which the metal concentration is close to 50%, it is possible to vary to a certain extent the nitrogen concentration while maintaining a stable state of the compound; this variation is noted ΔN (corresponding to the range of less than or equal to 10% targeted above). If ΔN is too large, the associated structure may be considered as defective. This is due to the fact that, in general, a mononitride structure consists of two subnetworks: the metal atoms occupy a first subnetwork of face-centered cubic orientation and the nitrogen atoms occupy all or part (especially as a function of the composition) of the octahedral sites of the metal network to form a second but offset face-centered cubic subnetwork, especially offset by a/2, "a" representing the lattice parameter of the fcc structure. In the particular case of titanium nitride, the composition in the stable state may be between $Ti_1N_{0.6}$ and $Ti_1N_{1.1}$ (or an N concentration from 37.5% to 52.4%, i.e. a ΔN of 15%). This size of ΔN means that for $Ti_1N_{0.6}$ the nitrogen subnetwork is lacunar and that for $Ti_1N_{1.1}$ the metal subnetwork is lacunar. For comparative purposes: for vanadium nitride, the concentration of N in the stable state ranges between 41.9% and 50%, i.e. a ΔN of 8.1%; for niobium nitride, the concentration of N in the stable state ranges between 48% and 51.4%, i.e. a ΔN of 3.4%; for tantalum nitride, the concentration of N in the stable state ranges between 48% and 50%, i.e. a ΔN of 2%; for chromium nitride, the concentration of N in the stable state ranges between 49.5% and 50%, i.e. a ΔN of 0.5%; for molybdenum nitride, the concentration of N in the stable state ranges between 29% and 35.4%, i.e. a ΔN of 6.4%; for hafnium nitride, the concentration in the stable state ranges between 42.8% and 52.8%, i.e. a ΔN of 10%; for zirconium nitride, the concentration in the stable state ranges between 40% and 50%, i.e. a ΔN of 10%.

Advantageously, the nanowire(s) 2 are made of gallium nitride. Gallium nitride is a good candidate for forming an electrooptic device. Specifically, such a nanowire 2 made of gallium nitride makes it possible to form a light nanoemitter.

GaN-based quantum wells may be added either in shell form around the nanowire, or in the continuity of the axis of the nanowire (axial structure). Depending on the composition of these GaN-based quantum wells, the spectral domain of the light emission may cover a wide wavelength range extending from ultraviolet to infrared.

Preferably, the buffer layer 3 is electrically conductive so as to allow an electrical contact between at least an electrically conductive part of the substrate 1 and the nanowire 2. The substrate 1 in its entirety may also be electrically conductive, and may then be made, for example, of n-doped silicon.

According to a particular embodiment, the end 2b of the nanowire 2 that is remote from the substrate 1 is electrically doped according to a first type (for example of n type), and the device comprises a doped electrically conductive element 5 of a second type (for example of p type) placed at the end 2b of the nanowire 2 that is remote from the substrate 1 so as to form an electrical junction. This electrical function is preferentially a light-emitting diode junction. The element 5 doped so as to form a junction with the end 2b of the nanowire 2 may at least partly cover the nanowire 2 at said end 2b. Preferably, the doped element 5 forms a sheath around the end 2b of the nanowire 2.

Preferentially, the device 4 comprises quantum wells (not shown) placed at the interface between the nanowire 2 and the doped electrically conductive element 5.

The device may comprise an element 100 for polarization of the nanowire 2 so as to allow the generation of a light wave at the level of said nanowire. It is thus understood that the device may be an electrooptic device. A polarization element comprises the means necessary for generating a current crossing the device. In the particular example of FIG. 1, the polarization element 100 may comprise a first electrical contact 100a in direct contact with the doped electrically conductive element 5, a second electrical contact 100b in direct contact with the substrate 1 and an energy source 100c. This makes it possible, for example, to inject electrons and holes so as to bring about their recombinations in a zone Z1 of the nanowire 2.

Moreover, in the context of an electrooptic device, the quantum wells may form, where appropriate, confinement zones so as to increase the emission yield of the nanowire 2.

An example based on a nanowire 2 has been given; needless to say, the device 4 may comprise a plurality of nanowires extending from the metal nitride layer so as to form, for example, a matrix of pixels. The elements 5 may then all be electrically linked to each other.

The device described above may be advantageously made at least partly via the process described below.

In general, in FIGS. 2 and 3, the process for growing at least one semiconductor nanowire 2 comprises a step of producing, on the substrate 1, the buffer layer 3 (FIG. 2) formed at least partly by a nucleation layer for the growth of the nanowire 2 and a step of growth of the nanowire 2 (FIG. 3) from the nucleation layer. On the example of FIGS. 2 and 3, the buffer layer 3 consists of the nucleation layer. In particular, the nucleation layer is formed by a layer of a transition metal nitride chosen from: vanadium nitride, chromium nitride, zirconium nitride, niobium nitride, molybdenum nitride, hafnium nitride or tantalum nitride. In other words, it may also be considered that the nucleation layer consists of a transition metal nitride layer as described. In order to optimize the growth, this nucleation/transition metal nitride layer may have a minimum thickness of 2 nm, and preferably between 2 nm and 50 nm.

In addition, as mentioned above, the buffer layer may be produced such that it is electrically conductive so as to allow an electrical contact between at least one electrically conductive part of the substrate and said at least one nanowire.

This buffer layer 3 may be made via any type of deposition technique. The transition metal nitride layer (i.e. the nucleation layer) thus obtained also makes it possible, by virtue of the transition metal used, to have a smaller gap than the AlN-based nucleation layers that have been very commonly used to date as nucleation layer. Thus, when the substrate 1 is based on silicon, the buffer layer 3 according to the invention has at its interface with the substrate 1 a potential barrier that is easier to cross than in the case where AlN is used, this giving an advantage when it is desired to polarize one or more nanowires from the substrate 1.

According to a first embodiment, the buffer layer 3 is deposited as a vapor phase from a gas mixture comprising nitrogen and a transition metal chosen from vanadium, chromium, zirconium, niobium, molybdenum, hafnium or tantalum, in particular the buffer layer 3 is deposited at a temperature between room temperature and 400° C. The nucleation layer is thus obtained directly, after this deposition. According to this first embodiment, the buffer layer 3 may consist of the nucleation layer, which itself consists of the transition metal nitride layer.

According to a second embodiment, the buffer layer 3 is made via the following steps: the deposition onto the substrate 1 of a layer of a transition metal chosen from vanadium, chromium, zirconium, niobium, molybdenum, hafnium or tantalum; and the nitridation of at least part of the deposited transition metal layer so as to form the transition metal nitride layer having a surface intended for growing the nanowire(s). Preferably, the transition metal layer 3 is deposited at a temperature between room temperature and 400° C. According to one implementation applicable to the different transition metals, especially for Hf, Nb and Ta, the deposited transition metal layer may have a thickness of between 20 nm and a few hundred nanometers (for example 200 nm). For the other transition metals, a thickness of 20 nm will be preferred. The deposition of the transition metal layer may be performed by PVD (physical vapor deposition) from a metal target, for example a continuous-current spray passing over the target. During this step of deposition of the transition metal, the substrate may be maintained at room temperature. In a general manner applicable throughout the description, the term "room temperature" means a temperature preferably between 20° C. and 50° C. The pressure in the PVD chamber during the deposition of the transition metal may be between $3 \times 10^{-3}$ mbar and $6 \times 10^{-3}$ mbar.

After various tests, it was possible to observe that the growth of the nanowire(s) was promoted by this nucleation layer formed in two steps. It is thus understood that this second mode is preferred.

As indicated previously in the particular description of the device, and in a manner applicable to the various embodiments of the growth process, the transition metal nitride layer may be the transition metal-nitrogen stoichiometric compound satisfying the conditions mentioned previously.

An example has been given based on the growth of a nanowire, but the growth process is not limited to this sole example and makes it possible, during the growth step, to grow a plurality of nanowires side by side using the nucleation layer.

It is understood from the foregoing that the function of the nucleation layer is to promote the nucleation of the nanowire(s). In addition, this nucleation layer is preferably chosen so as to protect the substrate 1 from any degradation during the growth (which may be the case if the substrate is made of silicon and the nanowire made of gallium nitride), and/or to conserve good stability at high temperatures (in the case of temperatures above 500° C.), and/or to give good electrical conduction especially when it is desired to polarize each nanowire and to inject current via the substrate 1. The materials of the nucleation layer targeted above make it possible to satisfy these problems.

As regards the substrate 1, the process may, in a nonlimiting manner, comprise a step in which the substrate is provided such that it has a resistivity of between 1 mΩ·cm and 100 mΩ·cm. This resistivity is advantageous when it is desired to polarize the nanowires as indicated above across the nucleation layer via the substrate 1.

In order to optimize the growth of the nanowire(s), it will thus be sought to have, in the nucleation layer, a crystallographic orientation adapted to the growth of the nanowires 2. The denser, i.e. the more predominant, this crystallographic orientation, the more the density of these nanowires 2 may be magnified.

In general, the step of growth of said at least one nanowire 2 may comprise a step of injecting a material intended at least partly to form the nanowire 2. In particular, this will be an injection of Ga so as to form the gallium nitride nanowire, said nanowire extending from the growth surface of the nucleation layer. To form the gallium nitride nanowire 2, the injection of Ga may be performed concomitantly with an injection of $NH_3$ or $N_2$. In general, for the synthesis of GaN, it is the reaction of Ga with $NH_3$ and not with $N_2$ that is used. The injection of Ga may be performed in a chamber adapted to the growth of nanowires.

The description below applies to the second embodiment of the growth process, i.e. to the metal nitride layer obtained in two steps.

In the case of the second embodiment of the growth process, it turns out that the metal nitride layer thus formed has growth sites whose crystallographic orientation is more favorable to the growth of nanowires than in the first mode. These growth sites are in greater number and have a better distribution than in the first mode.

It results from the foregoing that the crystallographic orientation of the nucleation layer, especially on a surface intended for growing the nanowire(s), is of importance in the context of promoting the growth of nanowires.

Thus, the step of deposition of the transition metal layer is preferentially performed such that said transition metal layer has, before the nitridation step, at least partly a crystallographic structure of centered cubic (CC) type for a layer of a transition metal chosen from Cr, Mo, V, Nb, Ta, or of hexagonal type for a layer of a transition metal chosen from Zr and Hf.

The specific orientations targeted previously make it possible to perform the step of nitridation of said at least part of the transition metal layer so as to at least partly modify the crystallographic structure of the transition metal layer toward a face-centered cubic structure, which is especially oriented [111], or hexagonal structure, which is especially oriented [0001] or along the direction of the axis "C", associated with the transition metal nitride layer. The transition metals of columns 4 and 6 preferentially form nitrides having an fcc crystallographic structure, whereas the transition metals of column 5 may form nitrides having an fcc or hexagonal crystallographic structure.

FIGS. 4 and 5 each illustrate an X-ray diffraction spectrum for identifying the crystallographic phases or structures present. FIG. 4 shows that for the curve C1 representing the crystallographic structure of the layer of transition metal of Nb type before nitridation, there is indeed a predominance of the orientation [110] of the centered cubic (cc) structure of Nb, and that for the curve C2 representative of the hexagonal crystallographic structure of the transition metal nitride layer NbN, there is indeed a predominance of the orientation [0004] of the hexagonal structure and of its orientation harmonic [0008], i.e. of similar orientation to [0001]. FIG. 5 shows that for the curve C3 representative of the crystallographic structure of the transition metal layer of Hf type before nitridation, there is indeed a predominance of the orientation [0002] of the hexagonal structure, and that for the curve C4 representative of the face-centered cubic (fcc) crystallographic structure of the transition metal nitride layer HfN, there is indeed a predominance of the orientation [111] of the face-centered cubic structure. On FIGS. 3 and 4, only the peaks are important for visualizing the predominance, the rest of the curve representing a continuous background due to the experimental device and the sample. Similar curves may be produced by a person skilled in the art for the other transition metals and the conclusions would be substantially identical, for example for tantalum nitride, there would be a predominance of the orientation [111] of the face-centered cubic structure of tantalum nitride.

According to a particular implementation of the second mode, especially illustrated in FIG. 6, the nitridation step may comprise a first substep of nitridation En1 performed at least partly at a first temperature by imposing an injection of a nitridation gas at a first flow rate, and a second substep of nitridation En2 performed at least partly at a second temperature less than or equal to the first temperature by imposing an injection of the nitridation gas at a second flow rate different (or not, i.e. the first flow rate may be equal to the second flow rate) from the first flow rate. This makes it possible to optimize the crystallographic orientation of the nucleation layer (transition metal nitride layer). It goes without saying that these two nitridation substeps are performed one after the other. In particular, the first substep En1 makes it possible to perform a rapid nitridation and the second substep En2 makes it possible to perform annealing which stabilizes the nitride phase of the transition metal. Following these two substeps En1 and En2, the transition metal nitride layer is chemically and thermally stable and can act as protection for the substrate (in particular if this substrate is made of silicon) during the growth of the nanowire(s).

The injected gas may be ammonia ($NH_3$) or dinitrogen ($N_2$). $NH_3$ is preferred since it makes it possible to nitride the transition metal layer more rapidly. In point of fact, in the $NH_3$ form, the nitriding power is greater than for $N_2$. This rapid nitridation may be important especially if the transition metal is capable of being transformed into silicide: this point is addressed hereinbelow.

According to a particular example, the injected nitridation gas being ammonia, the first temperature is between 1000° C. and 1050° C., especially equal to 1050° C., the first flow rate is between 500 sccm and 2500 sccm (sccm means "standard cubic centimeters per minute"), especially equal to 1600 sccm, the second temperature is between 950° C. and 1050° C., especially equal to 1000° C., the second flow rate is between 500 sccm and 2500 sccm, especially equal to 500 sccm.

The flow rates mentioned above correspond to the volume capacity of the nitridation chamber used, i.e. a total volume of gas (for example $N_2+NH_3$) of 8 liters in the example mentioned. For a chamber of a different volume, the flow rates must be adapted (for example: for an 18-liter chamber, the first flow rate will especially have to be equal to 4000 sccm and the second flow rate especially equal to 1200 sccm). In other words, the first flow rate is between 500*V/8 sccm and 2500*V/8 sccm, especially equal to 1600*V/8 sccm, and the second flow rate is between 500*V/8 sccm and 2500*V/8 sccm, especially equal to 500*V/8 sccm. V is the total capacity in liters of a corresponding nitridation chamber. The term "corresponding nitridation chamber" means herein the chamber in which the nitridation of the transition metal layer is performed.

In general, the nitridation step is performed in a nitridation chamber placed at a pressure of between 50 mbar and 800 mbar, especially 100 mbar.

FIG. 6 illustrates in a detailed manner the nitridation step by representing the change in temperature as a function of the time in a nitridation chamber. In a first time T1, the temperature in the nitridation chamber rises gradually, for example at 2° C./s up to a 1050° C. stage. The first nitridation substep under $NH_3$ En1 targeted above begins when the temperature reaches 200° C. During this first substep, the $NH_3$ flow rate remains constant at 1600 sccm. In a second time T2, concomitant with at least part of the first substep, the temperature is maintained at 1050° C. for a time of between 5 minutes and 15 minutes. In a third time T3, the first substep En1 is continued while the temperature passes from 1050° C. to 1000° C. in 60 s. In a fourth time T4, the temperature in the nitridation chamber is maintained at 1000° C. for a time of between 5 minutes and 15 minutes and the second substep En2 is started. In a fifth time T5, the introduction of heat into the nitridation chamber is stopped so that the temperature of the nitridation chamber falls until it returns to room temperature. The duration of T5 may correspond to the inertia of the nitridation chamber. The second nitridation substep may be continued for a given time during the fifth time T5. The fifth time T5 may correspond to stoppage of the heating of the chamber and then to its decrease in temperature or may also correspond to a step of growth of the nanowires if the chamber used for the nitridation is also the MOCVD chamber dedicated to the synthesis of the nanowires.

According to a particular implementation, the step of growth of the nanowire 2 is performed after the second nitridation substep En2, or is initiated during the second nitridation substep En2.

The use of Ga to form said at least one nanowire 2 is advantageous in the sense that the face-centered cubic or hexagonal structures of the transition metal nitride layer (and thus of the nucleation layer) are favorable to epitaxy of GaN. Nanowires made of gallium nitride, the crystallographic structure of which is a hexagonal structure (wurtzite structure) oriented along the axis [0001] or the axis C of FIG. 3, may be readily nucleated from the nucleation layer as described. Alternatively, the nanowires may also be made of ZnO, InN or SiC.

In order to achieve optimized nanowire growth, it is preferable for the transition metal layer to be sparingly silicidized/silicide formed. Silicidation of the transition metal layer may arise, if the substrate is based on silicon, according to two cases: during the step of deposition of the transition metal, and/or when it is desired to nitride the transition metal layer to delimit the nucleation layer. The first case may be explained in the following manner. In point of fact, at high temperature (about 1000° C.), the formation of silicide compounds $MSi_2$ is promoted (M being the transition metal used). Among these silicides, only silicides of transition metals from column V ($VSi_2$, $NbSi_2$, $TaSi_2$), plus chromium silicide ($CrSi_2$) form crystallographic phases of hexagonal structure, which are potentially advantageous (if textured along the axis c) for the growth of gallium nitride nanowire(s). However, the disagreement in lattice parameter "a" between these hexagonal phases and gallium nitride (3.19 Å) is so large, respectively −30%, −36%, −33% and −25% for $VSi_2$, $NbSi_2$, $TaSi_2$ and $CrSi_2$, that epitaxy of gallium nitride is highly improbable. Typically, the lattice parameter "a" for the hexagonal compounds $VSi_2$, $NbSi_2$, $TaSi_2$ and $CrSi_2$ is, respectively: 4.57 Å, 4.97 Å, 4.78 Å and 4.28 Å. Thus, a subfamily may be formed from the following materials: Ti, V, Cr, Nb, Ta, Mo, i.e. metals for which the interdiffusion coefficient with Si is high, which implies rapid growth kinetics of the new $MSi_2$ phase. By way of example, Cr has a coefficient of interdiffusion with Si at 850° C. of $1.5 \times 10^{-7}$ cm$^2$/s, i.e. a diffusion length of about 11.6 μm in 15 minutes, whereas at about 100° C., this diffusion length falls to about 80 nm in 15 minutes. For the reasons mentioned above, if the deposited transition metal is chosen from Cr, V and Ti, it is preferentially deposited at a temperature below 100° C. so as to limit the diffusion of the silicon derived from the substrate 1. For Nb, the Nb—Si interdiffusion length over 15 minutes is 12 nm and 2 nm, for 800° C. and 700° C., respectively. Nb may thus be deposited at high temperature up to 700-750° C. without—or with very little—silicidation. The other materials: Zr, Hf and Ta having smaller coefficients of interdiffusion with Si than Nb, may thus be readily deposited from room temperature up to 750° C.-800° C. at most. Excessive silicidation would have the consequence of not making it possible later to obtain a transition metal nitride layer of sufficient thickness. In other words, to generalize, when the substrate is silicon, the step of deposition of the transition metal layer is configured such that the interdiffusion of silicon into the deposited transition metal layer is less than 10 nm and/or so as to conserve a non-silicidized slice of the transition metal layer of at least 2 nm. In point of fact, this non-silicidized slice is opposite the substrate 1 and is intended to form the transition metal nitride layer. In FIG. 7, reference 6 indicates the transition metal layer initially deposited on the substrate 1, during the deposition of the layer, a slice 7 of this layer 6 may be silicidized such that only part 8 of the layer 6 is composed of the pure transition metal that can serve to form, by nitridation, the nucleation layer. In the second case, the nitridation step may make it necessary to work at 1050° C. for a few minutes. To do this, use will preferably be made as nitriding gas of $NH_3$, since, by virtue of its high nitriding power, the nitridation reaction rate is higher than the silicidation reaction rate. In point of fact, in the ideal case, it is sought to form during the nitridation step at least one transition metal nitride layer 9 (FIG. 8) in the deposited transition metal layer 6, the thickness of said metal nitride layer 9 advantageously being between 2 nm and 50 nm. In order to limit the production of a new silicide compound, the nitridation step will be optimized. In point of fact, after the nitridation step, it is understood, as illustrated in FIG. 8, that the layer that it was sought to produce by depositing a transition metal 6 may comprise a first transition metal silicide layer 7 obtained during the deposition of said transition metal, a second transition metal silicide layer 10 deposited in the continuity of the first transition metal silicide layer 7 and the nucleation layer 9 derived from the nitridation of the layer 8 of FIG. 7. Optionally, it is also possible that a residual layer 11 of pure transition metal remains intercalated between layer 9 and layer 10, this depending at least partly on the deposited thickness of the transition metal layer.

It results from the explanation of the first and second cases that if the substrate 1 is made of silicon, a person skilled in the art will be capable of determining the thickness of the transition metal layer to be deposited as a function of the type of transition metal to be deposited, of the temperature of deposition of the transition metal, of the duration of the transition metal deposition step, and also of the duration of the nitridation step so that it is possible to obtain a layer of transition metal nitride of a predetermined thickness. In other words, with the substrate 1 being based on silicon, the step of deposition of the transition metal layer 6 may comprise a preliminary step of determining the thickness of the transition metal layer 6 to be deposited, said step of determining the thickness comprising: a step of determining a first diffusion length of silicon into the transition metal layer 6 during the future deposition of the transition metal layer as a function of the transition metal used and of the deposition temperature; a step of determining a second diffusion length of silicon into the transition metal layer 6 during the future step of nitridation of the transition metal layer 6. Said thickness of the transition metal layer 6 to be deposited being a function of the desired thickness of the transition metal nitride layer and of a thickness of a silicidized slice of transition metal obtained in the future transition metal layer 6 from the first and second determined diffusion lengths.

Preferably, the predominant crystallographic structure of the substrate 1 is of orientation [100] at least at the interface between the substrate 1 and the transition metal layer 6. This makes it possible especially to reduce the manufacturing costs.

In general, the substrate 1 will advantageously be prepared before the deposition of the transition metal layer 6. To do this, the process may comprise, before the step of deposition of the transition metal layer 6, a step of deoxidation of a surface of the substrate 1 intended to receive the deposit of the transition metal layer 6. More particularly, this step of deoxidation of the surface of the silicon may be performed either chemically (HF bath) or physically (etching of the surface by applying a bias tension to the substrate 1). This makes it possible especially to remove the layer of native silicon oxide ($SiO_2$) which is an "insulating" barrier to the injection of electrons into the nucleation layer and into the gallium nitride nanowire.

Preferentially, the growth process described above in its various embodiments may be used in the context of forming a device as described previously.

Thus, the invention may also relate to a process for manufacturing a device, for example as described above, comprising a step of implementing the growth process as has been described above, especially in its various implementations or embodiments.

Moreover, the manufacturing process may also comprise a step of electrical doping of a first type of at least one end 2b of the nanowire 2 opposite the substrate 1. This first type is, preferably, doping of n type. In addition, the process also comprises a step of forming an electrically doped element 5 of a second type opposite the first type at the end 2b of the nanowire 2 opposite the substrate 1. This second type of doping is preferentially of p type. Thus, the end 2b of the nanowire 2 and the doped element 5 associated with this end 2b may form a junction of a diode intended to emit light. This junction is preferably a homojunction, i.e. the nanowire 2 and the associated doped element 5 are based on the same materials, for instance gallium nitride. The preparation of a heterojunction is also possible: for example, it is possible to use ZnO in the form of an n-doped nanowire, and then to add quantum wells based on ZnO and to use the element 9 made of electrically p-doped GaN. In point of fact, it is currently difficult to p-dope ZnO.

The manufacturing process may also comprise a step of forming quantum wells placed at the interface between the nanowire 2 and the electrically doped element 5 of the second type.

According to an alternative to the embodiment of FIG. 6, the nitridation step comprises a first nitridation substep En1 performed at least partly at a first temperature by imposing an injection of a nitridation gas at a first flow rate, a second nitridation substep En2 performed at least partly at a second temperature greater than or equal to the first temperature by imposing an injection of the nitridation gas at a second flow rate, which may or may not be different (i.e. the first flow rate may be equal to the second flow rate) from the first flow rate.

This alternative of FIG. 6 is illustrated in FIG. 9. Thus, in FIG. 9, the temperature T1 is between 400° C. and 1050° C. (or 1400° C.), especially between 500° C. and 800° C. and preferentially equal to 600° C.

The first substep En1 is divided for the sake of clarity into two steps: step 1 and step 2.

In step 1 of FIG. 9, a temperature rise up to T1 (i.e. the first temperature) is observed. The carrier gases are $N_2$, $N_2+H_2$ or $H_2$, preferentially $N_2$. The nitridation gas injected may be ammonia ($NH_3$) and the injection may commence at a temperature between room temp. (representative of room temperature) and T1; especially at and above 200° C. The temperature increase ramp from room temp. to T1 is greater than 1° C./min, and especially equal to 1° C./sec. During this step 1, the ammonia flow rate may be between 10×V/18 sccm and 4000×V/18 sccm, especially equal to 1200×V/18 sccm (in which V is the volume of the chamber in liters). In general, the ratio of the flow rates of ammonia to nitrogen ($NH_3/N_2$) may be between 0.0005% and 100%, preferably between 0.0055% and 22% and especially equal to 6.6%.

In step 2 of FIG. 9, annealing at T1 is performed. The carrier gases are $N_2$, $N_2+H_2$ or $H_2$, preferentially $N_2$. The nitridation gas injected may be ammonia ($NH_3$). The ammonia flow rate may be between 10×V/18 sccm and 4000×V/18 sccm, especially equal to 1200×V/18 sccm (in which V is the volume of the chamber in liters). In general, the ratio of the flow rates of ammonia to nitrogen ($NH_3/N_2$) may be between 0.0005% and 100%, preferably between 0.0055% and 22% and especially equal to 6.6%. Preferably, the annealing time under $NH_3$ is greater than 1 second, especially between 5 minutes and 30 minutes.

The second substep En2 is divided for the sake of clarity into three steps: step 3, step 4 and step 5. Preferably, the second temperature T2 is between 400° C. and 1050° C. (or 1400° C.), especially between 500° C. and 1000° C. and preferentially equal to 800° C. In step 3 (if T1≠T2, otherwise the process passes directly to step 4) there is a temperature rise up to T2. The carrier gases are $N_2$, $N_2+H_2$ or $H_2$, preferentially $N_2$. The nitridation gas injected may be ammonia ($NH_3$). The temperature increase ramp from T1 up to T2 is greater than 1° C./minute and especially equal to 1° C./sec. The ammonia flow rate may be between 10×V/18 sccm and 4000×V/18 sccm, especially equal to 1200×V/18 sccm (in which V is the volume of the chamber in liters). In general, the ratio of the flow rates of ammonia to nitrogen ($NH_3/N_2$) may be between 0.0005% and 100%, preferably between 0.0055% and 22% and especially equal to 6.6%.

In step 4, annealing at T2 is performed. The carrier gases are $N_2$, $N_2+H_2$ or $H_2$, preferentially $N_2$. The nitridation gas injected may be ammonia ($NH_3$). The ammonia flow rate may be between 10×V/18 sccm and 4000×V/18 sccm, especially equal to 1200×V/18 sccm (in which V is the volume of the chamber in liters). In general, the ratio of the flow rates of ammonia to nitrogen ($NH_3/N_2$) may be between 0.0005% and 100%, preferably between 0.0055% and 22% and especially equal to 6.6%. The annealing time under $NH_3$ is greater than 1 second, especially between 1 minute and 30 minutes.

In step 5, a temperature decrease is performed. The carrier gases are $N_2$, $N_2+H_2$ or $H_2$, preferentially $N_2$. The nitridation gas injected may be ammonia ($NH_3$). The temperature decrease ramp from T2 to room temp. is greater than 1° C./min and especially equal to 1° C./sec. The ammonia flow rate may be between 10×V/18 sccm and 4000×V/18 sccm, especially equal to 1200×V/18 sccm (in which V is the volume of the chamber in liters). In general, the ratio of the flow rates of ammonia to nitrogen ($NH_3/N_2$) may be between 0.0005% and 100%, preferably between 0.0055% and 22% and especially equal to 6.6%.

As regards this alternative of FIG. 9, the nitridation step may also be performed in a nitridation chamber placed at a pressure of between 50 mbar and 800 mbar, especially 100 mbar, and the step of growth of the nanowire (2) may be performed after the second nitridation substep (En2), or is initiated during the second nitridation substep (En2).

The steps associated with FIG. 6 are preferably performed when the transition metal is Ta (in this case the first temperature is preferentially greater than the second temperature during the nitridation step). Specifically, for this material, an appreciable improvement is obtained in the quality of the nanowires obtained (verticality, shape homogeneity) relative to the variant of FIG. 9. Conversely, and for the same reasons, the variant of FIG. 9 applies most particularly when it is sought to nitride the transition metal of Zr, Hf or Nb type (in this case the first temperature is preferentially less than the second temperature during the nitridation step).

The invention claimed is:

1. An electronic device comprising:
a substrate,
at least one semiconductor nanowire, and
a buffer layer interposed between the substrate and said nanowire,
wherein the buffer layer is at least partly formed by a transition metal nitride layer from which the nanowire extends, said transition metal nitride being selected from the group consisting of vanadium nitride, chromium nitride, zirconium nitride, niobium nitride, molybdenum nitride, and hafnium nitride, and
wherein the buffer layer is electrically conductive so as to allow an electrical contact between at least one electrically conductive part of the substrate and the nanowire,
wherein the transition metal nitride layer is a transition metal-nitrogen stoichiometric compound satisfying the following conditions:
the stoichiometric compound has a crystallographic structure favorable to the epitaxy of gallium nitride, especially a face-centered cubic or hexagonal crystallographic structure, and
a tolerance ΔN relative to the nitrogen concentration of less than or equal to 10%.

2. The device as claimed in claim 1, wherein the stoichiometric compound has a proportion of transition metal of between 50% and less than 100%.

3. The device as claimed in claim 1, wherein an end of the nanowire which is remote from the substrate is electrically doped according to a first type, and wherein the device comprises a doped electrically conductive element of a second type placed at the end of the nanowire which is remote from the substrate so as to form an electric junction.

4. The device as claimed in claim 1, comprising an element for polarizing the nanowire so as to allow the generation of a light wave at the level of said nanowire.

5. A process for growing at least one semiconductor nanowire comprising:
producing, on a substrate, a buffer layer formed at least partly by a nucleation layer for the growth of the nanowire, and
growing the nanowire from the nucleation layer,
wherein the nucleation layer is formed by a layer of a transition metal nitride selected from the group consisting of vanadium nitride, chromium nitride, zirconium nitride, niobium nitride, molybdenum nitride, and hafnium nitride, and
wherein the buffer layer is electrically conductive so as to allow an electrical contact between at least one electrically conductive part of the substrate and the nanowire,
wherein the transition metal nitride layer is a transition metal-nitrogen stoichiometric compound satisfying the following conditions:
the stoichiometric compound has a crystallographic structure favorable to the epitaxy of gallium nitride, especiall a face-centered cubic or hexagonal crystallographic structure, and
a tolerance ΔN relative to the nitrogen concentration of less than or equal to 10%.

6. The process as claimed in claim 5, wherein the buffer layer is deposited as a vapor phase from a gas mixture comprising nitrogen and a transition metal chosen from vanadium, chromium, zirconium, niobium, molybdenum, and hafnium.

7. The process as claimed in claim 5, wherein the buffer layer is produced via the following steps:
onto the substrate a layer of a transition metal selected from the group consisting of vanadium, chromium, zirconium, niobium, molybdenum, and hafnium,
performing nitridation of at least part of the deposited transition metal layer so as to form the transition metal nitride layer having a surface intended for the growth of the nanowire.

8. The process as claimed in claim 5, wherein the stoichiometric compound has a proportion of transition metal of between 50% and less than 100%.

9. The process as claimed in claim 7, wherein the step of nitridation of said at least part of the transition metal layer is performed so as to at least partly modify the crystallographic structure of the transition metal layer toward a face-centered cubic or hexagonal crystallographic structure, associated with the transition metal nitride layer.

10. The process as claimed in claim 7, wherein the nitridation step comprises:
a first nitridation substep at least partly performed at a first temperature by imposing an injection of a nitridation gas at a first flow rate, and
a second nitridation substep at least partly performed at a second temperature less than or equal to the first temperature by imposing an injection of the nitridation gas at a second flow rate that may or may not be different from the first flow rate.

11. The process as claimed in claim 10, wherein the injected nitridation gas is ammonia, and wherein:
the first temperature is between 1000° C. and 1050° C.,
the first flow rate is between 500*V/8 sccm and 2500*V/8 sccm,
the second temperature is between 950° C. and 1050° C., and
the second flow rate is between 500*V/8 sccm and 2500*V/8 sccm,
wherein V is a total capacity in liters of a corresponding nitridation chamber.

12. The process as claimed in claim 7, wherein the nitridation step comprises:
a first nitridation substep at least partly performed at a first temperature by imposing an injection of a nitridation gas at a first flow rate, and
a second nitridation substep at least partly performed at a second temperature greater than or equal to the first temperature by imposing an injection of the nitridation gas at a second flow rate that may or may not be different from the first flow rate.

13. The process as claimed in claim 10, wherein the nitridation step is performed in a nitridation chamber placed at a pressure of between 50 mbar and 800 mbar.

14. The process as claimed in claim 10, wherein the step of growing the nanowire is performed after the second nitridation substep, or is initiated during the second nitridation substep.

15. The process as claimed in claim 7, wherein the substrate is silicon, and wherein the step of depositing the transition metal layer is configured so that interdiffusion of silicon into the deposited transition metal layer is less than 10 nm and/or so as to conserve a non-silicidized slice of the transition metal layer of at least 2 nm.

16. The process as claimed in claim 7, wherein the deposited transition metal is chosen from Cr and V, and wherein said transition metal is deposited at a temperature below 100° C.

17. The process as claimed in claim 7, wherein the substrate is based on silicon, and wherein the step of depositing the transition metal layer comprises a preliminary step of determining the thickness of the transition metal layer to be deposited, comprising:
determining a first diffusion length of silicon into the transition metal layer during a future deposition of the transition metal layer as a function of the transition metal used and of the deposition temperature, and
determining a second diffusion length of silicon into the transition metal layer (6) during a future step of nitridation of the transition metal layer,
said thickness of the transition metal layer to be deposited being dependent on the desired thickness of the transition metal nitride layer and on a thickness of a silicidized slice of transition metal obtained in the future transition metal layer from the first and second determined diffusion lengths.

18. A process for manufacturing a device, comprising performing a process for growing at least one semiconductor nanowire comprising:
producing, on a substrate, a buffer layer formed at least partly by a nucleation layer for the growth of the nanowire, and
growing the nanowire from the nucleation layer, the nucleation layer is formed by a layer of a transition metal nitride chosen from the group consisting of vanadium nitride, chromium nitride, zirconium nitride, niobium nitride, molybdenum nitride, and hafnium nitride, and
wherein the buffer layer is electrically conductive so as to allow an electrical contact between at least one electrically conductive part of the substrate and the nanowire,
so as to obtain the device as claimed in claim 1.

19. The process as claimed in claim 18, comprising:
performing electrical doping of a first type of at least one end of the nanowire opposite the substrate, and
forming an electrically doped element of a second type opposite the first type at the end of the nanowire opposite the substrate.

20. The device as claimed in claim 2, wherein the electric junction is a light-emitting diode junction.

21. The process as claimed in claim 7, wherein the transition metal layer is deposited at a temperature between room temperature and 400° C.

22. An electronic device comprising:
a substrate,
at least one semiconductor nanowire, and
a buffer layer interposed between the substrate and said nanowire,
wherein the buffer layer is at least partly formed by a transition metal nitride layer from which the nanowire extends, said transition metal nitride being selected from the group consisting of vanadium nitride, chromium nitride, zirconium nitride, niobium nitride, molybdenum nitride, hafnium nitride and tantalum nitride,
wherein the buffer layer is electrically conductive so as to allow an electrical contact between at least one electrically conductive part of the substrate and the nanowire,
wherein an end of the nanowire which is remote from the substrate is electrically doped according to a first type, and wherein the device comprises a doped electrically conductive element of a second type placed at the end of the nanowire which is remote from the substrate so as to form an electric junction, and
wherein the transition metal nitride layer is a transition metal-nitrogen stoichiometric compound satisfying the following conditions:
the stoichiometric compound has a crystallographic structure favorable to the epitaxy of gallium nitride, especially a face-centered cubic or hexagonal crystallographic structure, and
a tolerance ΔN relative to the nitrogen concentration of less than or equal to 10%.

23. A process for growing at least one semiconductor nanowire comprising:
producing, on a substrate, a buffer layer formed at least partly by a nucleation layer for the growth of the nanowire, and
growing the nanowire from the nucleation layer,
wherein the nucleation layer is formed by a layer of a transition metal nitride chosen from the group consisting of vanadium nitride, chromium nitride, zirconium nitride, niobium nitride, molybdenum nitride, hafnium nitride and tantalum nitride,
wherein the buffer layer is electrically conductive so as to allow an electrical contact between at least one electrically conductive part of the substrate and the nanowire,
wherein an end of the nanowire which is remote from the substrate is electrically doped according to a first type, and wherein a doped electrically conductive element of a second type is placed at the end of the nanowire which is remote from the substrate so as to form an electric junction, and wherein the transition metal nitride layer is a transition metal-nitrogen stoichiometric compound satisfying the following conditions:

the stoichiometric compound has a crystallographic structure favorable to the epitaxy of gallium nitride, especially a face-centered cubic or hexagonal crystallographic structure, and a tolerance ΔN relative to the nitrogen concentration of less than or equal to 10%.

24. An electronic device comprising:

a substrate, at least one semiconductor nanowire, and a buffer layer interposed between the substrate and said nanowire, wherein the buffer layer is at least partly formed by a transition metal nitride layer from which the nanowire extends, said transition metal nitride being selected from the group consisting of vanadium nitride, chromium nitride, zirconium nitride, niobium nitride, molybdenum nitride, hafnium nitride and tantalum nitride, wherein the buffer layer is electrically conductive so as to allow an electrical contact between at least one electrically conductive part of the substrate and the nanowire, wherein the electronic device comprises an element for polarizing the nanowire so as to allow the generation of a light wave at the level of said nanowire, and wherein the transition metal nitride layer is a transition metal-nitrogen stoichiometric compound satisfying the following conditions:

the stoichiometric compound has a crystallographic structure favorable to the epitaxy of gallium nitride, especially a face-centered cubic or hexagonal crystallographic structure, and a tolerance ΔN relative to the nitrogen concentration of less than or equal to 10%.

25. A process for growing at least one semiconductor nanowire comprising:

producing, on a substrate, a buffer layer formed at least partly by a nucleation layer for the growth of the nanowire, and growing the nanowire from the nucleation layer, wherein the nucleation layer is formed by a layer of a transition metal nitride chosen from the group consisting of vanadium nitride, chromium nitride, zirconium nitride, niobium nitride, molybdenum nitride, hafnium nitride and tantalum nitride, wherein the buffer layer is electrically conductive so as to allow an electrical contact between at least one electrically conductive part of the substrate and the nanowire, wherein an element for polarizing the nanowire is provided so as to allow the generation of a light wave at the level of said nanowire, and wherein the transition metal nitride layer is a transition metal-nitrogen stoichiometric compound satisfying the following conditions:

the stoichiometric compound has a crystallographic structure favorable to the epitaxy of gallium nitride, especially a face-centered cubic or hexagonal crystallographic structure. and a tolerance ΔN relative to the nitrogen concentration of less than or equal to 10%.

26. The device as claimed in claim 1, wherein the nanowire is oriented substantially perpendicular to the substrate.

27. The process as claimed in claim 5, wherein the nanowire is oriented substantially perpendicular to the substrate.

* * * * *